(12) United States Patent
Yamamoto et al.

(10) Patent No.: US 11,131,935 B2
(45) Date of Patent: Sep. 28, 2021

(54) INFORMATION PROCESSING APPARATUS, STORAGE MEDIUM, LITHOGRAPHY APPARATUS, MANUFACTURING METHOD OF PRODUCT, AND MANUFACTURING SYSTEM OF PRODUCT

(71) Applicant: CANON KABUSHIKI KAISHA, Tokyo (JP)

(72) Inventors: Kenji Yamamoto, Utsunomiya (JP); Mitsuhiro Masuda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/788,708

(22) Filed: Feb. 12, 2020

(65) Prior Publication Data

US 2020/0264513 A1    Aug. 20, 2020

(30) Foreign Application Priority Data

Feb. 20, 2019   (JP) .............................. JP2019-028394

(51) Int. Cl.
  *G03F 7/20*    (2006.01)
(52) U.S. Cl.
  CPC .................................... *G03F 7/705* (2013.01)
(58) Field of Classification Search
  CPC ..... G03F 7/705; G03F 7/70125; G03F 9/7003
  USPC ............................................... 355/52, 53, 55
  See application file for complete search history.

(56) References Cited

U.S. PATENT DOCUMENTS

| 9,946,165 B2* | 4/2018 | Ypma ................. G03F 7/70641 |
| 2015/0183059 A1* | 7/2015 | Komine ............. G03F 7/70575 |
| | | 700/166 |
| 2020/0026196 A1* | 1/2020 | Luo ...................... G06K 9/6269 |

FOREIGN PATENT DOCUMENTS

JP         2011-187951 A        9/2011

* cited by examiner

*Primary Examiner* — Hung Nguyen
(74) *Attorney, Agent, or Firm* — Canon U.S.A., Inc. IP Division

(57) ABSTRACT

An information processing apparatus outputs correction data using a first system that outputs the correction data for correcting a condition defining processing to be performed in a lithography apparatus that forms a pattern onto a substrate. The first system includes a first model that outputs the correction data in case where a processing result indicating a result of the processing is input, and a second model that outputs the processing result in case where the condition is input. The first system corrects the condition using the correction data output from the first model, and outputs the correction data based on the processing result output by inputting the corrected condition to the second model.

15 Claims, 12 Drawing Sheets

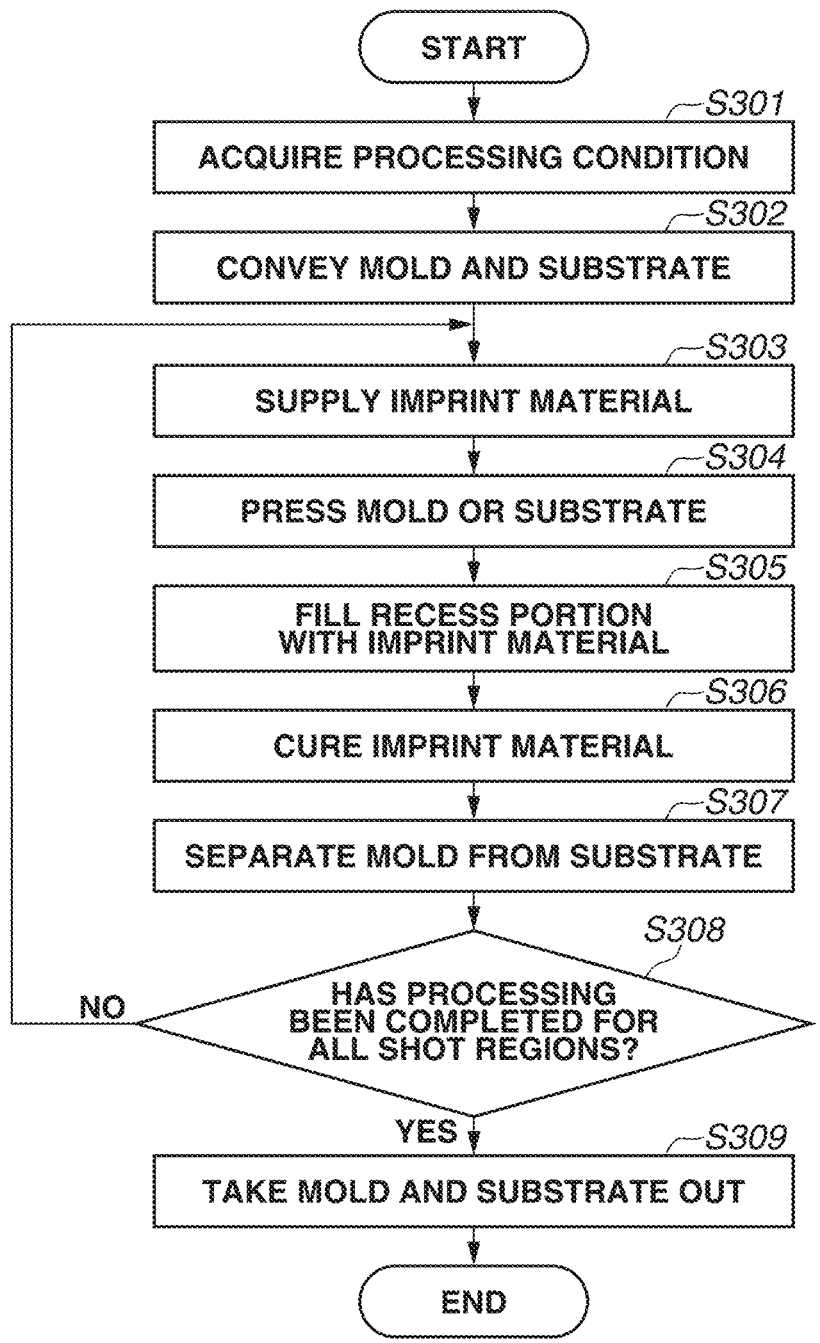

INFORMATION PROCESSING APPARATUS, STORAGE MEDIUM, LITHOGRAPHY APPARATUS, MANUFACTURING METHOD OF PRODUCT, AND MANUFACTURING SYSTEM OF PRODUCT

BACKGROUND

Field of the Disclosure

The present disclosure relates to an information processing apparatus, a computer readable storage medium, a lithography apparatus, a lithography system, and a manufacturing method of a product.

Description of the Related Art

In the manufacturing of products such as a semiconductor device, a microelectromechanical system (MEMS), or a flat display panel, a structure formed on a substrate has been getting more and more miniaturized, and there has been a growing demand for enhancement in performance of lithography apparatuses.

For satisfying the demand for enhancement in performance of lithography apparatuses, it is necessary to apply an appropriate processing condition when a lithography apparatus performs processing for forming a pattern onto a substrate.

Japanese Patent Application Laid-Open No. 2011-187951 discusses a technique of determining a processing result acquired by a control module of a lithography apparatus performing processing. More specifically, the technique determines whether the deviation of the processing result from a reference value exceeds an allowable range. Then, if it is determined that the deviation exceeds the allowable range, the technique applies a processing condition changed from a processing condition acquired from an external system such as a correction system (manufacturing execution system (MES)) and performs processing under the condition.

The technique discussed in Japanese Patent Application Laid-Open No. 2011-187951 is premised on the assumption that a way to change the processing condition for the processing result deviating from the allowable range is clear. Thus, if the way to change the processing condition for the processing result deviating from the allowable range is not clear, it can become difficult to change the processing condition. For example, if a new function is added to a lithography apparatus, a unit that acquires correction data for a processing condition related to the function can possibly be unclear.

SUMMARY

The present disclosure is directed to providing an information processing apparatus that provides a unit that acquires correction data for correcting a processing condition to be applied to processing performed in a lithography apparatus, a computer readable storage medium, a lithography apparatus, a manufacturing method of a product, and a manufacturing system of a product.

According to an aspect of the present invention, an information processing apparatus outputs correction data using a first system that outputs the correction data for correcting a condition defining processing to be performed in a lithography apparatus that forms a pattern onto a substrate, wherein the first system includes a first model that outputs the correction data in case where a processing result indicating a result of the processing is input, and a second model that outputs the processing result in case where the condition is input. The first system corrects the condition using the correction data output from the first model, and outputs the correction data based on the processing result output by inputting the corrected condition to the second model.

Further features of the present invention will become apparent from the following description of exemplary embodiments with reference to the attached drawings.

BRIEF DESCRIPTION OF THE DRAWINGS

FIG. 3 is a flowchart illustrating imprint processing.

DESCRIPTION OF THE EMBODIMENTS

Figure 1:
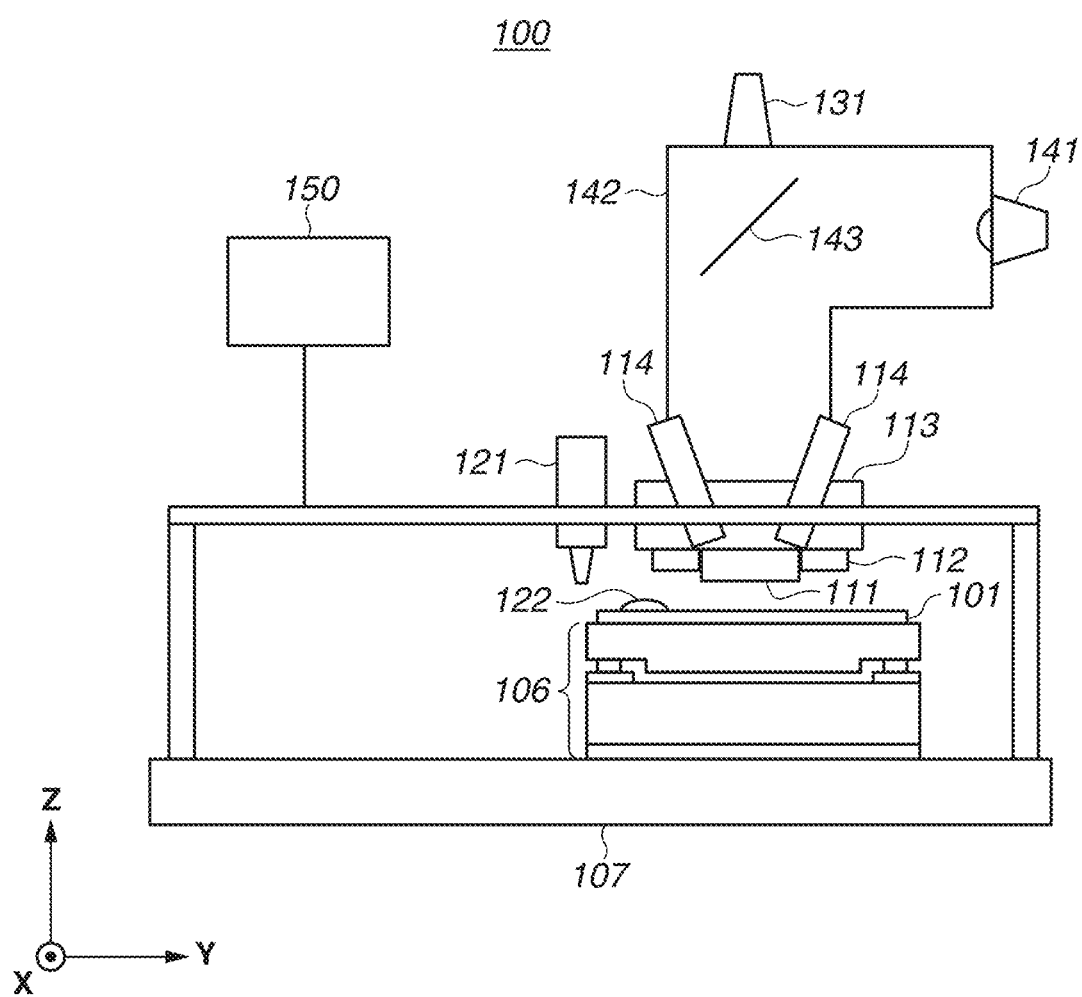
FIG. 1 is a diagram illustrating an imprint apparatus.

Hereinafter, exemplary embodiments of the present invention will be described in detail with reference to the drawings. In the drawings, the same components are assigned the same reference numerals and the redundant description will be omitted.

Hereinafter, a first exemplary embodiment will be described. In the present exemplary embodiment, an example in which an imprint apparatus is used as a lithography apparatus will be described. FIG. 1 is a diagram illustrating an imprint apparatus. First of all, representative configurations of the imprint apparatus will be described with reference to FIG. 1. An imprint apparatus 100 is an apparatus that forms a pattern of a cured material onto which an uneven pattern of a mold 111 (original) is transferred, by bringing an imprint material 122 supplied onto a substrate 101 and the mold 111 into contact with each other, and supplying curing energy to the imprint material 122.

A curable composition (sometimes also referred to as an uncured-state resin) that cures by supplied curing energy is used as the imprint material 122. Examples of the curing energy include electromagnetic waves and heat. As electromagnetic waves, light such as infrared light, visible light, or ultraviolet light that has a wavelength selected from the range of 150 nm or more and 1 mm or less, for example, is used.

The curable composition is a composition that cures by being irradiated with light or being heated. Among the curable compositions, a photocurable composition that cures by being irradiated with light contains at least a polymerizable compound and a photopolymerization initiator, and may contain a nonpolymerizable compound or a solvent as necessary. The nonpolymerizable compound is a nonpolymerizable compound of at least one type selected from the group consisting of a sensitizer, a hydrogen donator, an internally-additive mold release agent, a surface-activating agent, an antioxidizing agent, and a polymer component.

The imprint material 122 is applied onto the substrate 101 in a film shape by a spin coater or a slit coater. Alternatively, the imprint material 122 may be applied onto the substrate 101 by a liquid injection head in a droplet state or in an island shape or a film shape formed from a plurality of continuous droplets. The viscosity (viscosity at 25° C.) of the imprint material 122 is 1 mPa·s or more and 100 mPa·s or less, for example.

Glass, ceramics, metal, or resin is used for the substrate 101, and a member made of material different from the material of the substrate 101 may be formed on the surface of the substrate 101 as necessary. Specific examples of the substrate 101 include a silicon wafer, a compound semiconductor wafer, and a glass wafer containing quartz as material.

The mold 111 has a rectangular outer peripheral shape, and includes a pattern portion including a pattern (uneven pattern such as a circuit pattern that is to be transferred onto the substrate 101) three-dimensionally formed on a surface (pattern surface) facing the substrate 101. The mold 111 is formed of material that can let through light, such as quartz. The mold 111 further includes a recess portion on the opposite side of the pattern portion.

In the present exemplary embodiment, the description will be given assuming that the imprint apparatus 100 employs a light curing method that cures the imprint material 122 by light irradiation. In the following description, a direction parallel to an optical axis of light emitted onto the imprint material 122 on the substrate 101 is defined as a Z-axis direction, and two directions orthogonal to each other in a plane vertical to the Z-axis direction are defined as an X-axis direction and a Y-axis direction. In addition, rotation about an X-axis, rotation about a Y-axis, and rotation about a Z-axis are defined as $\theta X$, $\theta Y$, and $\theta Z$, respectively. The control or movement relative to the X-axis, the Y-axis, or the Z-axis means the control or movement relative to a direction parallel to the X-axis, a direction parallel to the Y-axis, or a direction parallel to the Z-axis, respectively. In addition, the control or movement relative to $\theta X$, $\theta Y$, or $\theta Z$ means the control or movement relative to rotation about an axis parallel to the X-axis, rotation about an axis parallel to the Y-axis, or rotation about an axis parallel to the Z-axis, respectively. In addition, a position means information that can be identified based on coordinates in the X-axis direction, the Y-axis direction, and the Z-axis direction, and orientation means information that can be identified based on values of $\theta X$, $\theta Y$, and $\theta Z$. In addition, a plane including the X-axis and the Y-axis is defined as an X-Y plane, a plane including the X-axis and the Z-axis is defined as an X-Z plane, and a plane including the Y-axis and the Z-axis is defined as a Y-Z plane.

The imprint apparatus 100 can include a substrate stage 106, a mold holding unit 113, a mold correction unit 112, an irradiation unit 142, an alignment measuring unit 114, a supply unit 121, an imaging unit 131, and a control unit 150.

The substrate stage 106 holds and moves the substrate 101. The substrate stage 106 includes a suction unit (not illustrated) and can hold the substrate 101 by sucking the substrate 101 by the suction unit. A method by which the suction unit sucks the substrate 101 can be a vacuum suction method, an electrostatic suction method, or another suction method. The substrate stage 106 further includes a driving unit (not illustrated) such as a linear motor, and can move the substrate 101 in the X-axis direction, the Y-axis direction, and $\theta Z$ (desirably, the X-axis direction, the Y-axis direction, the Z-axis direction, $\theta X$, $\theta Y$, and $\theta Z$), for example. In addition, the substrate stage 106 can be supported by a stage surface table 107 placed on a floor surface.

The mold holding unit 113 holds and moves the mold 111. The mold holding unit 113 includes a suction unit (not illustrated) and can hold the mold 111 by sucking the mold 111. A method by which the suction unit sucks the mold 111 can be a vacuum suction method, an electrostatic suction method, or another suction method. The mold holding unit 113 further includes a driving unit (not illustrated) such as a voice coil motor, and can move the mold 111 in the Z-axis direction, $\theta X$, and $\theta Y$ (desirably, the X-axis direction, the Y-axis direction, the Z-axis direction, $\theta X$, $\theta Y$, and $\theta Z$).

The substrate stage 106 and the mold holding unit 113 adjust relative positions and relative orientations of the substrate 101 and the mold 111, and move at least either one of the substrate 101 and the mold 111 such that the imprint material 122 on the substrate 101 and the pattern portion of the mold 111 are brought into contact with each other. In addition, the substrate stage 106 and the mold holding unit 113 move at least either one of the substrate 101 and the mold 111 such that the cured imprint material 122 and the pattern portion of the mold 111 are separated from each other. Since it is necessary to precisely adjust the positions and orientations of the substrate 101 and the mold 111, the driving units of the substrate stage 106 and the mold holding unit 113 may each include a plurality of driving units such as a coarse motion driving unit and a fine motion driving unit.

The mold holding unit 113 can further include one or a plurality of sensors (not illustrated) that detects at least either one of pressing force and mold release force that are added to the mold 111. The pressing force is force added to the mold 111 for bringing the mold 111 into contact with the imprint material 122 on the substrate 101. The mold release force is force added to the mold 111 for separating the imprint material 122 on the substrate 101 and the mold 111 from each other. The pressing force and the mold release force mainly act in a direction extending along the Z-axis direction. The pressing force and the mold release force are correlated with the magnitude of current supplied to the driving unit of the mold holding unit 113, for example, and the sensor can detect the pressing force and the mold release force based on the magnitude of the current. The sensor is an example of a sensor that measures at least either one of pressing force and mold release force that are added to the mold 111 in pattern formation. If the driving unit of the mold holding unit 113 includes a plurality of sensors, it is possible to detect pressing force and mold release force acting at a plurality of positions in the mold 111, and acquire distribution information of pressing force and mold release force.

The mold correction unit 112 corrects the shape of the pattern portion of the mold 111 for fitting the shape of the pattern portion of the mold 111 with the shape of a shot region of the substrate 101. In some cases, deformation including a component such as a magnification component or a trapezoidal component may occur in the pattern portion of the mold 111 due to a manufacturing error or thermal deformation. The mold correction unit 112 can use a unit that deforms the shape of the pattern portion of the mold 111 in a direction extending along the X-Y plane, by adding force from a plurality of positions on the side surface of the mold 111, for example. The mold correction unit 112 includes a plurality of actuators that adds force in a direction (direction extending along the X-Y plane) for pushing each side of the mold 111 toward the center, for example. Then, by each actuator individually adding force from the side surface of the mold 111, the shape of the pattern portion of the mold 111 can be corrected. As the actuator of the mold correction unit 112, for example, a linear motor, an air cylinder, or a piezo actuator is used.

The irradiation unit 142 emits curing light (e.g., light such as ultraviolet light) for curing the imprint material 122, onto the imprint material 122 on the substrate 101. The irradiation unit 142 includes, for example, a light source 141 that emits curing light, and an optical element 143 including a mirror that deflects an optical path of light emitted from the light source 141. The irradiation unit 142 can further include a plurality of optical elements (not illustrated) that adjusts light emitted from the light source 141, to light appropriate for imprint processing. In addition, the wavelength of light emitted from the light source 141 can be appropriately determined depending on the type of the imprint material 122. The mold holding unit 113 further includes an opening region (not illustrated) at a center portion (inner side) thereof such that light emitted from the irradiation unit 142 is emitted onto the substrate 101 via the mold 111. The irradiation unit 142 may further include a substrate deformation unit (not illustrated) that deforms the shot region, to fit the shape of the shot region of the substrate 101 with the shape of the pattern portion of the mold 111. For example, as the substrate deformation unit, a unit that deforms the shot region in a direction extending along the X-Y plane, by emitting light (e.g., light such as infrared light) that does not cure the imprint material 122, from the irradiation unit 142 onto the shot region, and thermally expanding the shot region is used.

The alignment measuring unit 114 measures relative positions in the direction extending along the X-Y plane of the shot region formed on the substrate 101 and the pattern portion of the mold 111 in which the pattern is formed. For example the alignment measuring unit 114 illuminates an alignment mark of the substrate 101 and an alignment mark of the mold 111, and measures relative positions of the alignment marks using captured images of these alignment marks. Then, the alignment measuring unit 114 measures relative positions in the direction extending along the X-Y plane of the shot region formed on the substrate 101 and the pattern portion of the mold 111 in which the pattern is formed based on the detection result. The alignment measuring unit 114 can be positioned by a driving unit (not illustrated) in accordance with the position of an alignment mark to be observed. In addition, for concurrently measuring a plurality of alignment marks provided on each of the substrate 101 and the mold 111, a plurality of alignment measuring units 114 may be provided.

A supply unit 121 supplies the imprint material 122 onto the substrate 101 by discharging the imprint material 122 by an inkjet method, for example. In addition, the supply unit 121 supplies the imprint material 122 in accordance with a processing condition that defines a supply amount of the imprint material 122 and a position to which the imprint material 122 is to be supplied. A supply amount of the imprint material 122 and a position to which the imprint material 122 is to be supplied are predefined in view of the thickness and density of a pattern to be formed on the substrate 101, and the processing condition is stored into, for example, a storage unit of the control unit 150, which will be described below. The substrate 101 held by the substrate stage 106 moves while the supply unit 121 is supplying the imprint material 122, and the imprint material 122 is supplied to a predetermined position on the substrate 101.

The imaging unit 131 includes a camera, for example, and can capture an image of a region including the pattern portion of the mold 111, via the optical element 143. The imaging unit 131 acquire image data by capturing an image of the imprint material 122 which is in contact with the pattern portion of the mold 111. The state of the imprint material 122 in contact with the pattern portion of the mold 111 can be checked based on the image data acquired by the imaging unit 131. In addition, image data to be acquired may be data of a still image or may be data of a moving image.

The control unit 150 controls, for example, imprint processing of forming a pattern onto the substrate 101, by controlling operations and adjustment of each unit of the imprint apparatus 100 such as the substrate stage 106. The control unit 150 is an information processing apparatus that can include, for example, a programmable logic device (PLD) such as a field programmable gate array (FPGA), an application specific integrated circuit (ASIC), or a program-installed computer, or a combination of a part or all of these. The control unit 150 may be formed integrally (in a common casing) with other portions of the imprint apparatus 100, or may be formed separately (in a casing different) from other portions of the imprint apparatus 100.

Figure 2:
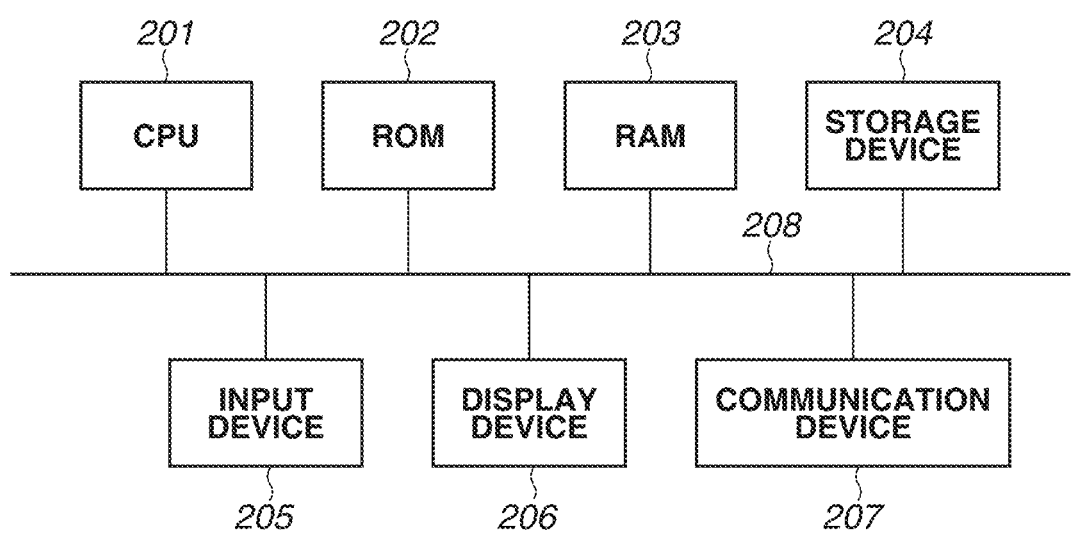
FIG. 2 is a diagram illustrating an information processing apparatus.

FIG. 2 is a diagram illustrating an information processing apparatus. Each component of the information processing apparatus functions in accordance with a program. In the example illustrated in FIG. 2, a central processing unit (CPU) 201 is a processing device that performs calculation for control in accordance with a program, and controls each component connected to a bus 208. A read-only memory ROM 202 is a memory dedicated to data reading, and stores programs and data. A random access memory (RAM) 203 is a memory for data reading and writing, and is used for storing programs and data. The RAM 203 is used for temporarily storing data such as a calculation result of the CPU 201. A storage device 204 is also used for storing programs and data. The storage device 204 is also used as a temporary storage area of data and programs of an operating system (OS) of the information processing apparatus. Although data input-output speed of the storage device 204 is slower than that of the RAM 203, the storage device 204 can store large-volume data. The storage device 204 is desirably a nonvolatile storage device that can permanently store data so as to make stored data referable for a long period of time. The storage device 204 mainly includes a magnetic storage device (hard disk drive (HDD)), but may be a device that performs data reading and writing by loading an external medium such as a compact disc (CD), a digital versatile disk (DVD), or a memory card. At least one of the ROM 202, the RAM 203, and the storage device 204 is used as a storage unit of the information processing apparatus. An input device 205 is a device for inputting characters or data into the information processing apparatus, and includes various keyboards or a mouse. A display device 206 is a device, such as a cathode-ray tube (CRT) and a liquid crystal monitor, for displaying information necessary for the operation of the information processing apparatus and a processing result. A communication device 207 is used when data communication is performed in accordance with a communication protocol such as a transmission control protocol/internet protocol (TCP/IP), by connecting to a network (not illustrated), and communication is performed with another information processing apparatus.

Next, imprint processing performed by the imprint apparatus 100 will be described. FIG. 3 is a flowchart illustrating imprint processing. In step S301, the control unit 150 acquires a processing condition including data such as a parameter that defines a condition of imprint processing. The control unit 150 may acquire the processing condition from the storage unit of the control unit 150, or may acquire the processing condition from an external information processing apparatus via a network.

In step S302, the control unit 150 causes a mold conveyance unit (not illustrated) to convey the mold 111 to the mold holding unit 113. Similarly, the control unit 150 causes a substrate conveyance unit (not illustrated) to convey the substrate 101 to the substrate stage 106.

In step S303, the control unit 150 moves the substrate stage 106 such that the shot region on the substrate 101 is positioned below the supply unit 121. Then, the control unit 150 causes the supply unit 121 to supply the imprint material 122 to the shot region on the substrate 101.

Figure 4A:
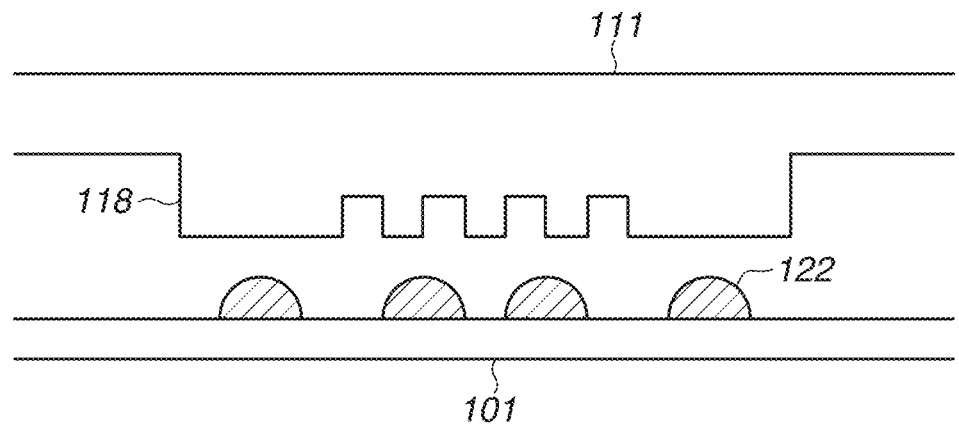
FIGS. 4A, 4B, and 4C are diagrams illustrating a pattern portion of a mold and an imprint material supplied onto a substrate.
Figure 4B:
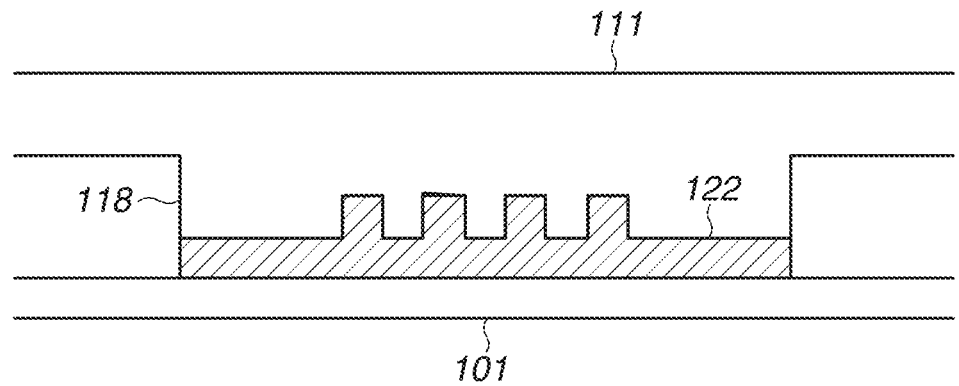
Figure 4C:
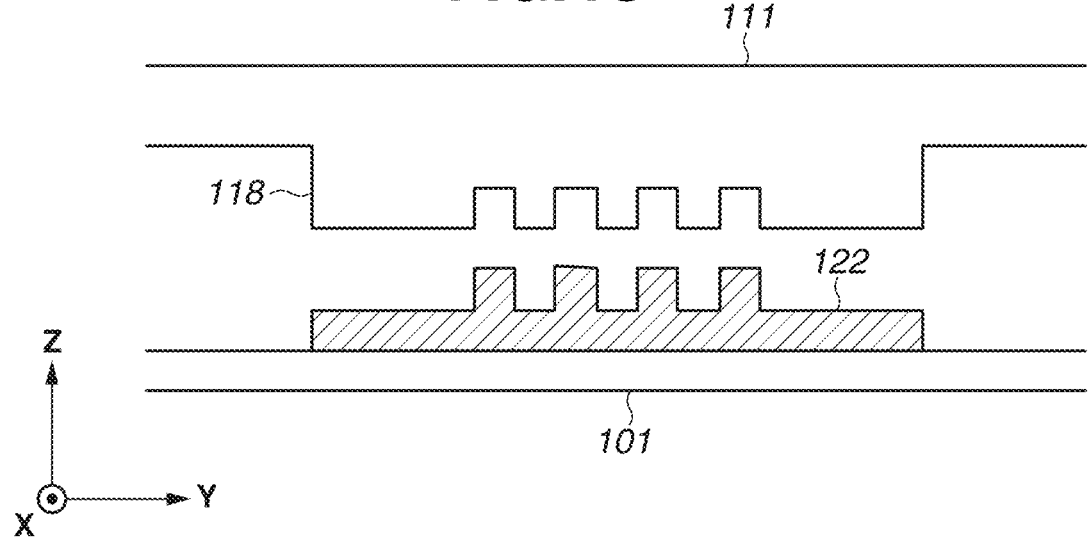

In step S304, the control unit 150 moves the substrate stage 106 such that the shot region supplied with the imprint material 122 is positioned below the pattern portion of the mold 111 held by the mold holding unit 113. FIGS. 4A to 4C are diagrams illustrating a pattern portion 118 of the mold 111 and the imprint material 122 supplied on the substrate 101. FIG. 4A illustrates a state in which the shot region supplied with the imprint material 122 is positioned below the pattern portion 118 of the mold 111.

By moving the mold 111 in a lower direction (−Z-axis direction) by the mold holding unit 113, the control unit 150 presses the pattern portion 118 of the mold 111 against the imprint material 122 on the shot region (pressing). At this time, the control unit 150 may move the substrate 101 in an upper direction (+Z-axis direction) by the substrate stage 106.

In step S305, for filing recess portions of the pattern portion 118 of the mold 111 with the imprint material 122, the control unit 150 controls the mold holding unit 113 and the substrate stage 106 to keep a distance between the pattern portion 118 of the mold 111 and the substrate 101 constant. FIG. 4B illustrates a state in which the pattern portion 118 of the mold 111 is pressed against the imprint material 122 on the shot region, and the recess potions of the pattern portion 118 of the mold 111 are filled with the imprint material 122. In step S305, the control unit 150 causes the alignment measuring unit 114 to measure relative positions of the shot region and the pattern portion 118 of the mold 111. Then, the control unit 150 moves at least one of the substrate stage 106 and the mold holding unit 113 in the X-Y plane direction based on the measured positions, and aligns the positions of the shot region and the pattern portion 118 of the mold 111. In addition, the control unit 150 causes the alignment measuring unit 114 to measure alignment marks on a plurality of shot regions in advance, and stores information obtained by statistically processing the measurement result, into the storage unit. Then, the positions of the shot region and the pattern portion 118 of the mold 111 can be aligned based on the information obtained by statistically processing the measurement result.

In step S306, the control unit 150 cures the imprint material 122 on the substrate 101 (curing) by emitting curing light to the imprint material 122 on the substrate 101 by the irradiation unit 142.

In step S307, the control unit 150 separates the pattern portion 118 of the mold 111 and the imprint material 122 on the substrate 101 (mold releasing) by moving the mold 111 in the upper direction (+Z-axis direction) by the mold holding unit 113. At this time, the control unit 150 may move the substrate 101 in the lower direction (−Z-axis direction) by the substrate stage 106 instead. FIG. 4C illustrates a state in which the pattern portion 118 of the mold 111 and the imprint material 122 on the substrate 101 are separated from each other, and a pattern of the imprint material 122 is formed on the substrate 101.

Figure 5:
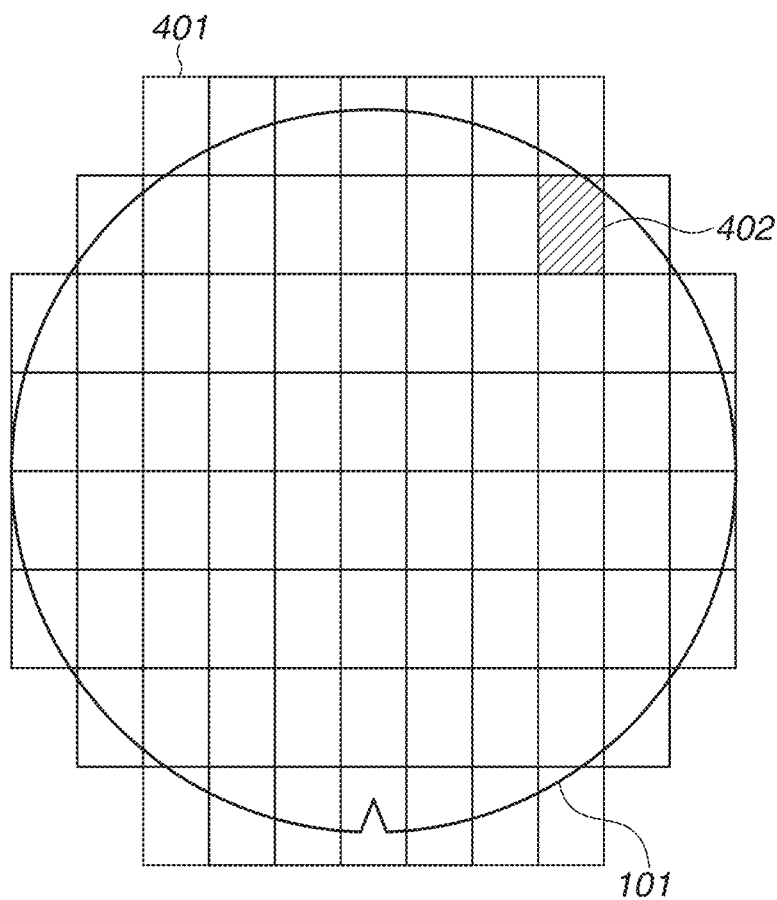
FIG. 5 is a diagram illustrating a layout of a shot region in which a pattern is formed.

In step S308, the control unit 150 determines whether imprint processing has been completed for all of a plurality of shot regions on the substrate 101. FIG. 5 is a diagram illustrating a layout of a shot region in which a pattern is formed. A layout 401 indicates information regarding the arrangement of a plurality of shot regions 402 on the substrate 101, and is defined by a processing condition. The description has been given using an example that a pattern is formed onto one shot region in processing from steps S303 to S307, but a pattern may be formed onto a plurality of shot regions in processing from steps S303 to S307.

If it is determined that the imprint processing has been completed for all the shot regions (YES in step S308), the processing proceeds to step S309. On the other hand, if it is determined that the imprint processing has not been completed for all the shot regions (NO in step S308), the processing returns to S303, and the control unit 150 supplies the imprint material 122 to a shot region for which the imprint processing has not been completed.

In step S309, the control unit 150 takes the mold 111 out from the mold holding unit 113 by a mold conveyance unit (not illustrated). The control unit 150 also takes the substrate 101 out from the substrate stage 106 by a substrate conveyance unit (not illustrated).

At this time, if imprint processing is performed by the imprint apparatus 100, the control unit 150 stores a command value for controlling the mold holding unit 113 and the substrate stage 106, into the storage unit. The control unit 150 also stores measurement values and image data that have been obtained from the alignment measuring unit 114 and the imaging unit 131, into the storage unit of the control unit 150. In addition, the control unit 150 also stores information obtained by statistically processing the stored command values, measurement values, and image data, into the storage unit. The information stored in the storage unit is transmitted to a correction system 500 (second system) via a network. The correction system 500 is a system that performs manufacturing management and process control of a manufacturing apparatus such as the imprint apparatus 100. Then, in the correction system 500, the received information is analyzed, and a processing condition to be applied to imprint processing is corrected for improving the imprint processing in the imprint apparatus 100.

Figure 12:
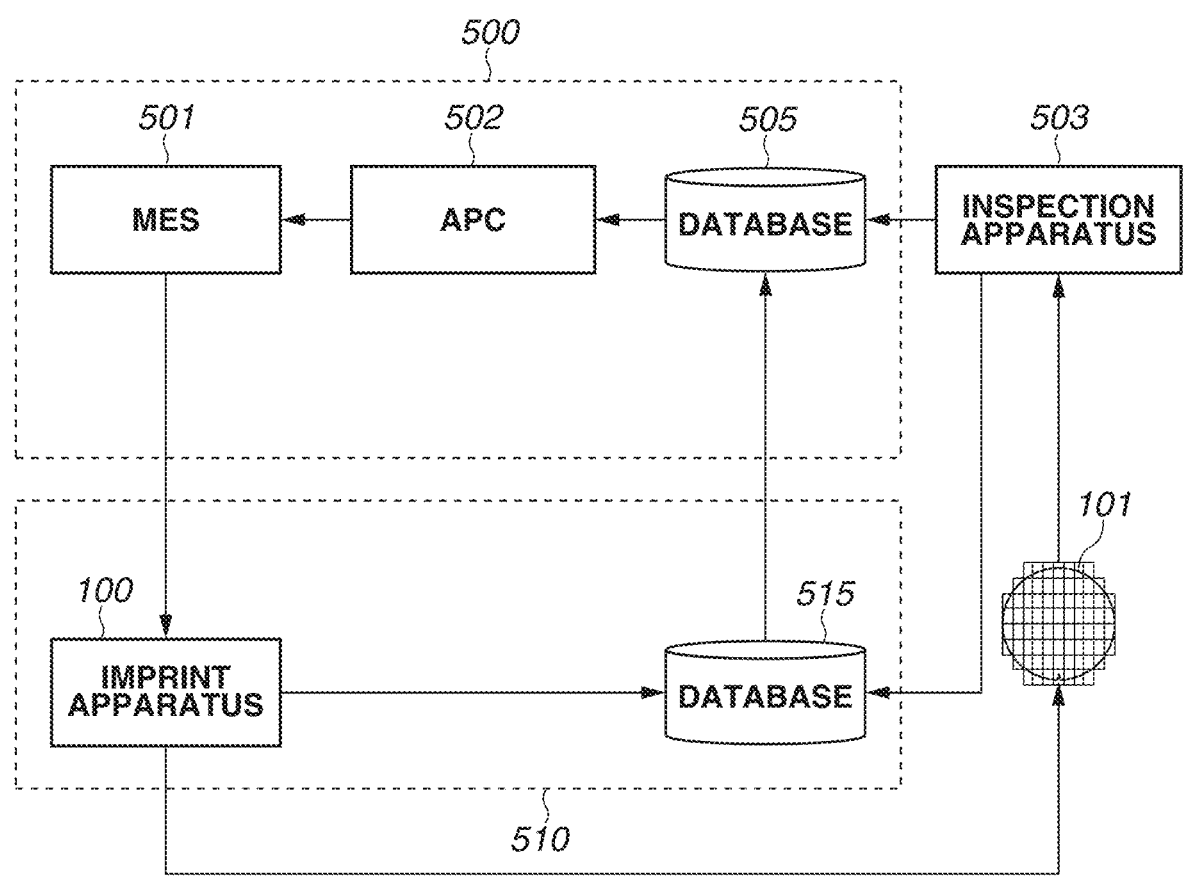
FIG. 12 is a diagram illustrating a conventional manufacturing system of a product.

Next, a manufacturing system of a product that includes the correction system 500 and an apparatus system 510 including the imprint apparatus 100 will be described. FIG. 12 is a diagram illustrating a conventional manufacturing system of a product. The conventional manufacturing system of a product includes the correction system 500, the apparatus system 510, and an inspection apparatus 503, for example. The correction system 500 includes a manufacturing execution system (MES) 501, an advanced process control (APC) 502, and a database 505, for example.

The MES 501 comprehensively manages manufacturing and instructs imprint processing by outputting a processing condition to the imprint apparatus 100. The APC 502 controls a processing condition to be applied to imprint processing in the imprint apparatus 100. The MES 501 and the APC 502 each include one or a plurality of information processing apparatuses. The MES 501 and the APC 502 may each include one information processing apparatus instead.

The substrate 101 processed by the imprint apparatus 100 is conveyed to the inspection apparatus 503, and the inspection apparatus 503 inspects the substrate 101. The inspection apparatus 503 can include an overlay inspection apparatus, a CD inspection apparatus, a pattern inspection apparatus, and an electrical characteristic inspection apparatus, for example. The overlay inspection apparatus is an apparatus that inspects the precision of a position shift by measuring a position shift amount (hereinafter, referred to as a position shift amount of a pattern) of an upper layer pattern and a lower layer pattern in a substrate on which patterns are formed in a multilayered manner. The CD inspection apparatus is an apparatus that inspects the precision of the dimension of a pattern by measuring the dimension of a line width of a pattern formed on a substrate. In addition, the pattern inspection apparatus is an apparatus that inspects the existence or non-existence of a nonstandard pattern not satisfying a standard due to a foreign substance adhering on a substrate on which a pattern is formed, or an imprint material unfilled state, and the position of the nonstandard pattern. The electrical characteristic inspection apparatus is an apparatus that inspects the precision of electrical characteristics of a semiconductor device or the like that has been manufactured from a substrate on which a pattern is formed. The inspection apparatus 503 includes at least one information processing apparatus, and can transmit information regarding an inspection result to the database 505 via a network.

The database 505 is included in the storage unit of the information processing apparatus and holds various types of information. The database 505 transmits and receives various types of information to and from an external information processing apparatus. The database 505 may be included in a storage unit of the information processing apparatus included in the MES 501 or the APC 502.

The apparatus system 510 includes the imprint apparatus 100 and a database 515, for example. In the example illustrated in FIG. 12, one imprint apparatus 100 is connected to the correction system 500, but a plurality of imprint apparatuses 100 may be connected to the correction system 500. An apparatus connected to the correction system 500 is not limited to the imprint apparatus 100, and an exposure apparatus that exposes a substrate or a drawing apparatus that performs drawing onto a substrate by charged particle radiation (electron beams, ion beams, etc.) via a charged particle optical system may be connected to the correction system 500. A coating apparatus that coats a substrate with a photosensitizing agent, a development apparatus that develops an exposed substrate, an etching apparatus that etches an oxidized film on a substrate, or a film formation apparatus that forms a thin film onto a substrate may be connected to the correction system 500. In addition, a plurality of apparatuses including the imprint apparatus 100, the exposure apparatus, and the drawing apparatus may be connected to the correction system 500.

The database 515 is included in the storage unit of the information processing apparatus and holds various types of information. The database 515 transmits and receives various types of information to and from an external information processing apparatus. The database 515 may be included in the storage unit of the control unit 150 of the imprint apparatus 100.

The manufacturing system includes the correction system 500 and the apparatus system 510, and the correction system 500 and the apparatus system 510 are both connected to a network. In addition, the correction system 500 and the apparatus system 510 can transmit and receive various types of information to and from each other via the network.

The imprint apparatus 100 acquires a processing condition from the correction system 500 (the MES 501) and executes imprint processing in accordance with the processing condition. Nevertheless, for manufacturing a product such as a semiconductor device at a good yield ratio, it is necessary to execute imprint processing in accordance with a processing condition optimized depending on a manufacturing process or the imprint apparatus 100. In the correction system 500, it is therefore necessary to manage a plurality of processing conditions optimized depending on a manufacturing process or the imprint apparatus 100.

The processing condition can include information regarding an amount of the imprint material 122 to be supplied by the supply unit 121 onto the substrate 101, and a position to which the imprint material 122 is to be supplied by the supply unit 121. The processing condition can further include information regarding an alignment mark position of the mold 111 and an alignment mark position of the substrate 101 that are measured by the alignment measuring unit 114. The processing condition can further include information regarding a time period for which the pattern portion of the mold 111 and the imprint material 122 on the substrate 101 are kept in contact with each other by the driving of the mold holding unit 113 and the substrate stage 106. The processing condition can further include information regarding the magnitude of force (pressing force or mold release force) to be added to the mold 111 in the Z-axis direction in a state in which the pattern portion of the mold 111 and the imprint material 122 on the substrate 101 are in contact with each other. The processing condition can further include information regarding an amount of curing light to be emitted onto the imprint material 122 by the irradiation unit 142, and a time period for which curing light is to be emitted onto the imprint material 122 by the irradiation unit 142. The processing condition can further include information regarding the magnitude of force to be added by the mold correction unit 112 to the side surface of the mold 111 in the direction extending along the X-Y plane. The processing condition can further include information regarding an irradiation amount of light to be emitted for heating the substrate by the substrate deformation unit of the irradiation unit 142, an irradiation amount distribution, and an irradiation time period.

Next, processing for correcting a processing condition will be described. The imprint apparatus 100 receives a processing condition from the MES 501. Next, the control unit 150 of the imprint apparatus 100 controls each unit of the imprint apparatus 100 to perform imprint processing in accordance with the received processing condition. Processing data (processing result) acquired as data indicating a result of imprint processing is held in the database 515. The substrate 101 having been subjected to the imprint processing is conveyed to the inspection apparatus 503, and an inspection such as an overlay inspection, an inspection of the dimension of a pattern, an inspection for foreign substances, or an electrical characteristic inspection is performed.

In addition, the database 505 receives and holds processing data from the database 515 and processing data from the inspection apparatus 503.

The processing data can include various types of information acquired as a result of imprint processing performed by the imprint apparatus 100. The processing data can include information regarding command values for driving the alignment measuring unit 114, the mold holding unit 113, and the substrate stage 106. The processing data can further include information regarding measurement values measured by the alignment measuring unit 114. The measurement values can include information regarding a measurement value related to the position of an alignment mark, and measurement values related to relative positions of alignment marks. The processing data can further include information regarding an image of an alignment mark that has been captured by the alignment measuring unit 114. The processing data can further include information regarding an image of the imprint material 122 being in contact with the pattern portion of the mold 111 that has been captured by the imaging unit 131. The processing data can further include information regarding force (mold release force or pressing force) acting on the mold 111 that has been measured by the mold holding unit 113.

The processing data can further include information acquired as a result of an inspection performed by the inspection apparatus 503. The processing data can include information regarding a position shift amount of a pattern. The processing data can further include information regarding the dimension of a line width of a pattern formed on the substrate 101. The processing data can further include information regarding the presence or absence of a pattern on the substrate 101 that does not satisfy a standard, and the position of the pattern not satisfying the standard. The processing data can further include information regarding electrical characteristics of a semiconductor device manufactured from the substrate 101 on which the pattern is formed.

The APC 502 acquires information regarding a processing result and information regarding a measurement result from the database 505 as processing data, analyzes various types of information included in the acquired processing data, acquires correction data for information included in a processing condition, and corrects the information included in the processing condition.

The correction data can include information regarding correction values for correcting an amount of the imprint material 122 to be supplied by the supply unit 121 onto the substrate 101, and a position to which the imprint material 122 is to be supplied by the supply unit 121. The correction data can further include information regarding correction values for correcting an alignment mark position of the mold 111 and an alignment mark position of the substrate 101 that are to be measured by the alignment measuring unit 114. The correction data can further include information regarding a correction value for correcting a time period for which the pattern portion of the mold 111 and the imprint material 122 on the substrate 101 are kept in contact with each other by the driving of the mold holding unit 113 and the substrate stage 106. The correction data can further include information regarding correction values for correcting an amount of curing light to be emitted onto the imprint material 122 by the irradiation unit 142, and a time period for which curing light is to be emitted onto the imprint material 122 by the irradiation unit 142. The correction data can further include information regarding a correction value for correcting the magnitude of force to be added to the mold 111 by the mold correction unit 112. The correction data can further include information regarding correction values for correcting an irradiation amount of light to be emitted to heat the substrate by the substrate deformation unit of the irradiation unit 142, an irradiation amount distribution, and an irradiation time period.

The MES 501 transmits the corrected processing condition to the imprint apparatus 100, and the imprint apparatus 100 executes imprint processing in accordance with the corrected processing condition. By the correction of a processing condition, it becomes possible to manufacture a product such as a semiconductor device while maintaining a good yield ratio.

In addition, if imprint processing is performed by the imprint apparatus 100, it is possible to acquire information regarding measurement values of a plurality of alignment marks measured by the alignment measuring unit 114. In addition, the imaging unit 131 can acquire a plurality of pieces of image data of still images of a region including the pattern portion of the mold 111. The imaging unit 131 can also acquire image data of a moving image of a region including the pattern portion of the mold 111. Furthermore, it is possible to acquire a measurement value obtained by measuring thrust force of a linear motor or a voice coil motor that serves as a driving unit of the mold holding unit 113 or the substrate stage 106. In particular, based on a plurality of measurement values obtained by periodically measuring thrust force of the driving unit in processing from steps S304 to S307 in FIG. 3, it is possible to obtain information regarding a variation in force acting on the mold 111 and the substrate 101. While information in imprint processing can be acquired from each unit in this manner, for acquiring correction data for further enhancing the precision of pattern formation, the APC 502 needs to acquire and analyze a great deal of detailed information.

In the case of acquiring correction data from processing data and a processing condition in the APC 502, correction data can be acquired from the processing data and the processing condition using a table or a mathematical formula if a relationship between the processing condition and the processing data is clear. Nevertheless, if a relationship between the processing condition and the processing data is not clear, it is difficult to acquire correction data from the processing data and the processing condition using a table or a mathematical formula. For example, it is easy to obtain a mathematical formula for calculating correction data related to an alignment mark position included in a processing condition, from information regarding the position of an alignment mark measured by the alignment measuring unit 114 that has been acquired as processing data. For example, it is identified that information regarding a position shift amount of a pattern is correlated with the magnitude of force added to the mold 111 by the mold correction unit 112. Nevertheless, because the degree of correlation of the magnitude of force added to the mold 111 with respect to a position shift amount of a pattern is not clear, it is difficult to acquire correction data using a table or a mathematical formula.

In view of the foregoing, in the present exemplary embodiment, correction data is acquired using a subsystem 700 (first system) that uses processing data and a processing condition as input, and outputs correction data. The subsystem 700 uses first processing data 611 and a first processing condition 612 as input, and outputs first correction data 613. The subsystem 700 includes a correction model 701 (first model) and an apparatus model 702 (second model). The subsystem 700 further includes one or a plurality of programs, and is implemented by the one or the plurality of programs being operated in the information processing apparatus. In addition, the subsystem 700 may include one or a plurality of programs operating with being incorporated in a main program. The subsystem 700 can further include data such as parameters defining the structures of the correction model 701 and the apparatus model 702.

Figure 6A:
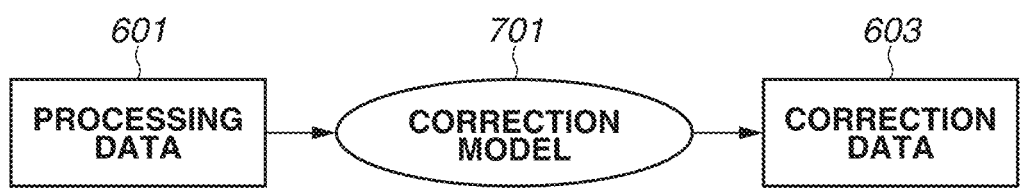
FIGS. 6A and 6B are diagrams illustrating a correction model and an apparatus model.
Figure 6B:
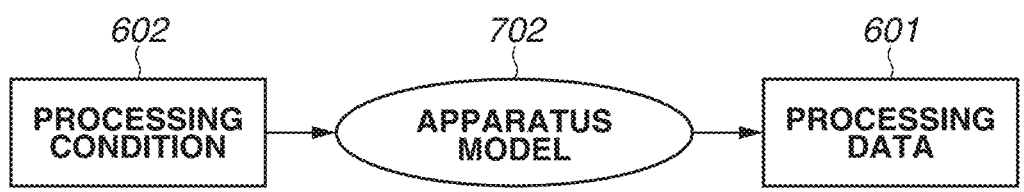

The correction model 701 and the apparatus model 702 will now be described. FIGS. 6A and 6B are diagrams illustrating the correction model 701 and the apparatus model 702, respectively. The correction model 701 illustrated in FIG. 6A can include a learning model acquired by machine learning. If processing data 601 is input to the correction model 701, correction data 603 is acquired as output.

The generation of the correction model 701 in an overlay inspection will now be described. First of all, learning data indicating a relationship between input data and training data is prepared. The input data is the processing data 601 acquired as a result of performing imprint processing. The processing data 601 can include, for example, a position shift amount of a pattern that is obtained by performing an inspection by the inspection apparatus 503. The training data is the correction data 603 for correcting the processing condition 602 with respect to the processing data 601 serving as input data. The correction data 603 can include, for example, information regarding a correction value for correcting the magnitude of force to be added to the mold 111 by the mold correction unit 112. The correction data 603 can further include, for example, information regarding at least one of a correction value for correcting an irradiation amount of light to be emitted by the substrate deformation unit, a correction value for correcting an irradiation amount distribution, and a correction value for correcting an irradiation time period. Machine learning is performed using such prepared learning data indicating a relationship between input data and training data. Machine learning can be performed using a neural network, for example. The neural network is a model having a multilayer network structure including an input layer, an intermediate layer, and an output layer. A stochastic variable in the network is optimized by an algorithm, such as an error backpropagation method, using learning data indicating a relationship between input data and training data, and thereby a learning model can be acquired. The example of acquiring a learning model using the neural network has been described, but an acquisition method is not limited to the neural network. For example, another model and algorithm, such as a support vector machine and a decision tree, may be used. Then, by inputting new processing data 601 to the acquired correction model 701, the correction data 603 is output as output data. The processing data 601 and the correction data 603 are not limited to the above-described examples. If there is a plurality of combinations of the processing data 601 and the correction data 603, the correction model 701 may include a plurality of learning models. In addition, aside from a learning model, the correction model 701 may also include a model that acquires the processing data 601 and the correction data 603 using a table or a mathematical formula that indicates a relationship between the processing condition 602 and the processing data 601.

The apparatus model 702 illustrated in FIG. 6B is a learning model acquired by machine learning, for example. If the processing condition 602 is input to the apparatus model 702, the processing data 601 is acquired as output. The generation of the apparatus model 702 in an overlay inspection will now be described. First of all, learning data indicating a relationship between input data and training data is prepared. The input data is the processing condition 602 that defines a condition of imprint processing. For example, the processing condition 602 can include at least one of the magnitude of force to be added to the mold 111 by the mold correction unit 112, an irradiation amount of light to be emitted by the substrate deformation unit, an irradiation amount distribution, and an irradiation time period. The training data is the processing data 601 acquired by performing imprint processing based on the processing condition 602 serving as input data. The processing data 601 can include a position shift amount of a pattern obtained by performing an inspection by the inspection apparatus 503, for example. Machine learning is performed using such prepared learning data indicating a relationship between input data and training data. Machine learning can be performed using a neural network, for example. Then, by inputting a new processing condition 602 to the acquired apparatus model 702, the processing data 601 is output as output data. The processing condition 602 and the processing data 601 are not limited to the above-described examples. In addition, if there is a plurality of combinations of the processing condition 602 and the processing data 601, the apparatus model 702 may include a plurality of learning models. In addition, aside from a learning model, the apparatus model 702 may also include a model that acquires the processing condition 602 and the processing data 601 using a table indicating a relationship between the processing condition 602 and the processing data 601.

Figure 7:
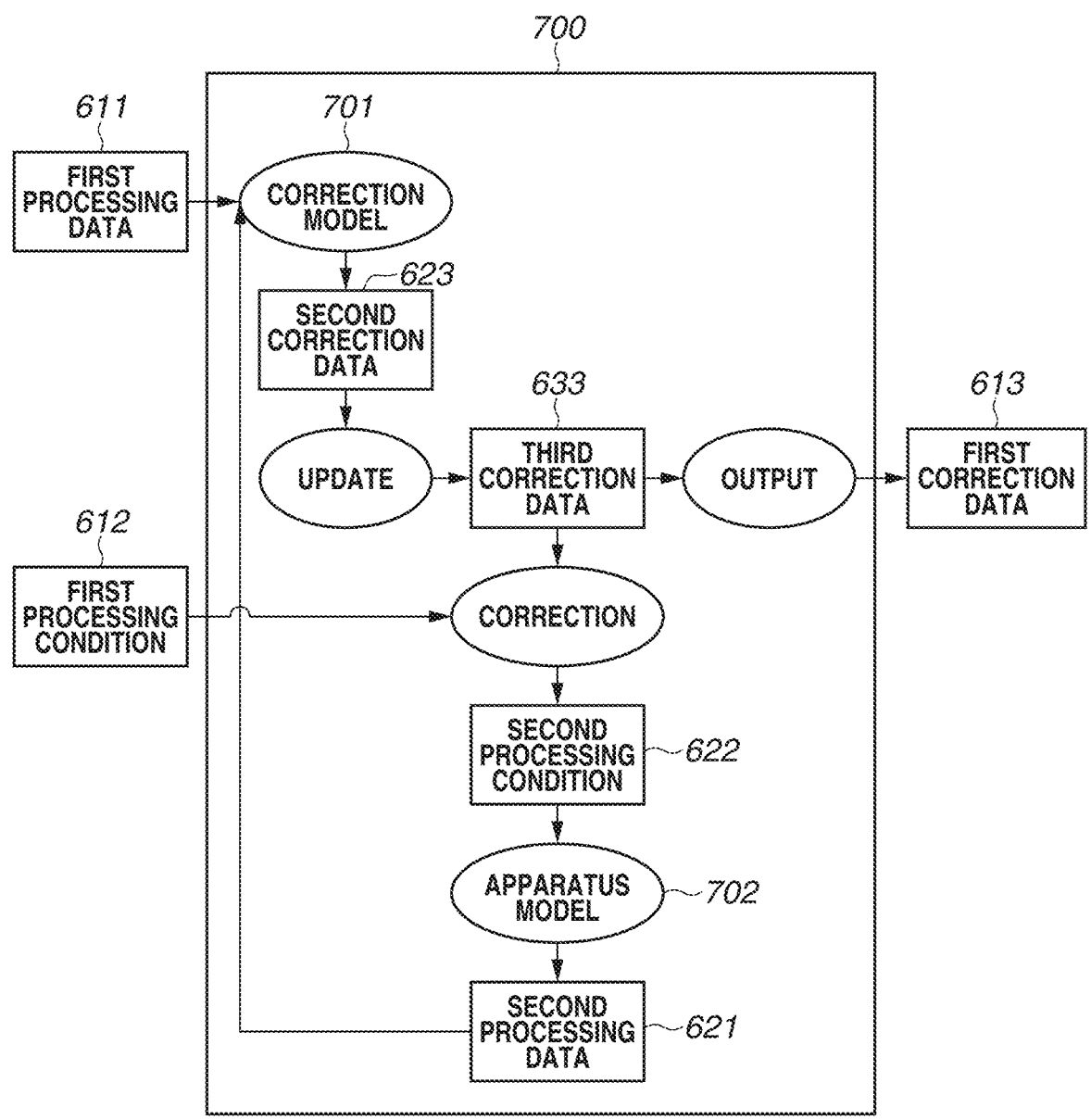
FIG. 7 is a diagram illustrating a subsystem.
Figure 8:
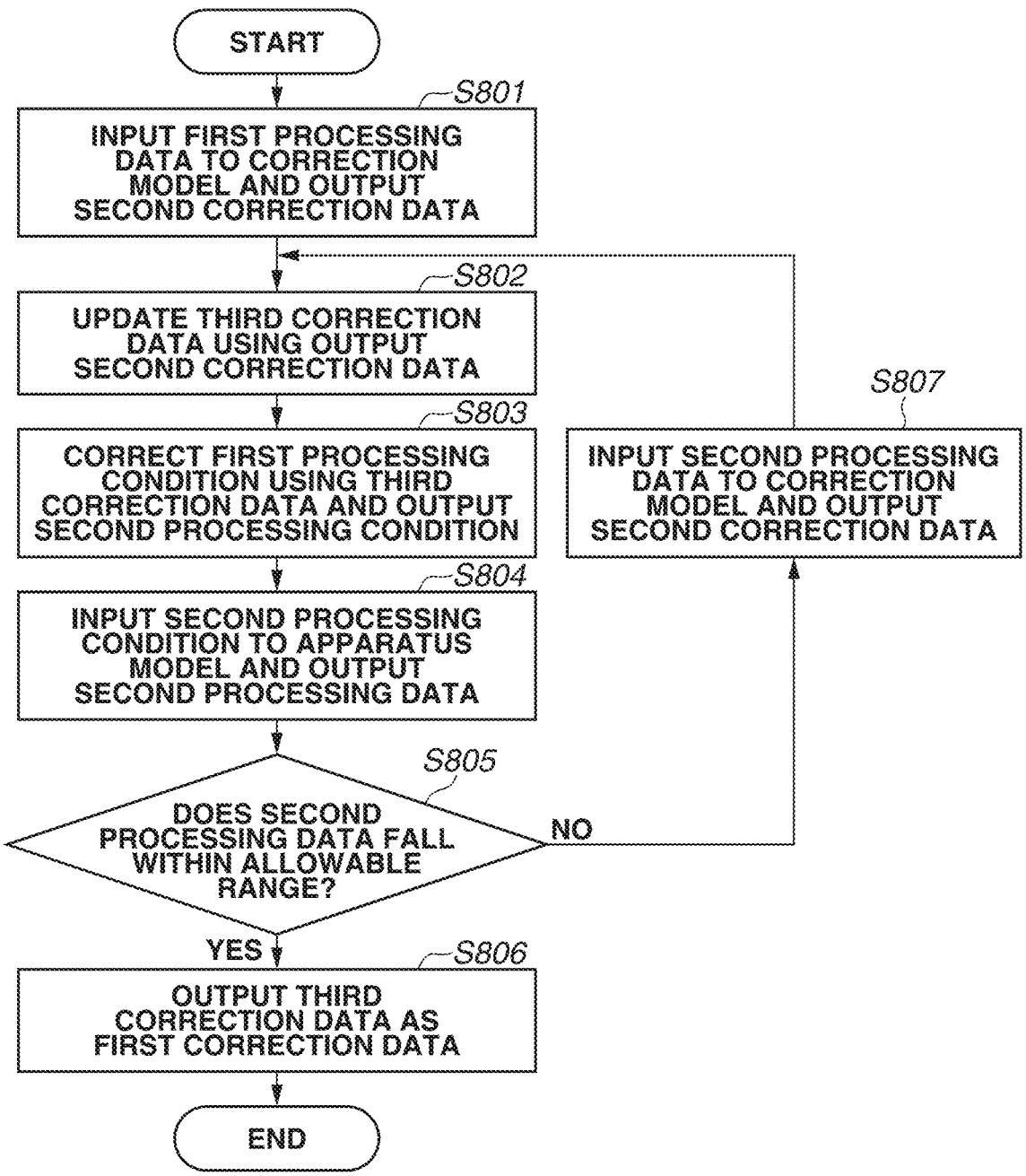
FIG. 8 is a flowchart illustrating processing in the subsystem.

Next, processing in the subsystem 700 will be described with reference to FIGS. 7 and 8. FIG. 7 is a diagram illustrating the subsystem 700. FIG. 8 is a flowchart illustrating processing in the subsystem 700. In step S801, the first processing data 611 is input to the correction model 701, and second correction data 623 is output from the correction model 701. In step S802, third correction data 633 is updated using the output second correction data 623. If the third correction data 633 is initially updated using the second correction data 623, the third correction data 633 is replaced with the second correction data 623. If the third correction data 633 is updated using the second correction data 623 for the second and subsequent times, for example, the third correction data 633 may be updated by adding a correction value included in the second correction data 623 to a correction value in the third correction data 633. Alternatively the third correction data 633 may be updated by, for example, multiplying a correction value in the third correction data 633 by a ratio between a correction value included in the second correction data 623 and a previous correction value. The third correction data 633 may also be updated by, for example, performing matrix operation of a correction value in the third correction data 633 using a matrix obtained from a correction value included in the second correction data 623.

In step S803, the first processing condition 612 input to the subsystem 700 is corrected using the third correction data 633 updated in step S802, and a second processing condition 622 is output. In step S804, the output second processing condition 622 is input to the apparatus model 702, and second processing data 621 is output from the apparatus model 702. In step S805, it is determined whether the second processing data 621 output from the apparatus model 702 falls within a predefined allowable range. If it is determined that the second processing data 621 falls within the predefined allowable range (YES in step S805), the processing proceeds to step S806. In step S806, the third correction data 633 updated in step S802 is output from the subsystem 700 as the first correction data 613. On the other hand, if it is determined that the second processing data 621 does not fall within the predefined allowable range (NO in step S805), the processing proceeds to step S807. In step S807, the second processing data 621 output from the apparatus model 702 is input to the correction model 701. Then, new second correction data 623 with respect to the input second processing data 621 is output from the correction model 701. Then, the processing returns to step S802. In step S802, the third correction data 633 is updated using the output second correction data 623. Then, in step S803, the first processing condition 612 is corrected again using the third correction data 633 updated in step S802, and the second processing condition 622 is output. The above-described processing is repeatedly performed until the second processing data 621 output from the apparatus model 702 falls within the predefined allowable range.

If the second processing data 621 includes a plurality of pieces processing data, the predefined allowable range is defined for each piece of the processing data. For example, in the case of a position shift amount of a pattern, an allowable range of a position shift amount of a pattern is predefined in accordance with desired positional precision of the pattern.

The processing data 601 in FIGS. 6A and 6B is information similar to the first processing data 611 described with reference to FIG. 7. The processing condition 602 in FIG. 6B is information similar to the first processing condition 612 and the second processing condition 622 described with reference to FIG. 7. In addition, the correction data 603 is information similar to the first correction data 613 and the second correction data 623 described with reference to FIG. 7. The first processing data 611 and the first processing condition 612 are pieces of data input to the subsystem 700. The first processing condition 612 is applied to imprint processing performed by the imprint apparatus 100, and the first processing data 611 is acquired as a result of the imprint processing. Meanwhile, the second processing data 621 and the second processing condition 622 are processing data and a processing condition that are acquired in the subsystem 700 while the first correction data 613 is acquired. The first correction data 613 is correction data for correcting the first processing condition 612, and is correction data output from the subsystem 700. The second correction data 623 and the third correction data 633 are pieces of correction data acquired in the subsystem 700 while the first correction data 613 is acquired.

Figure 9:
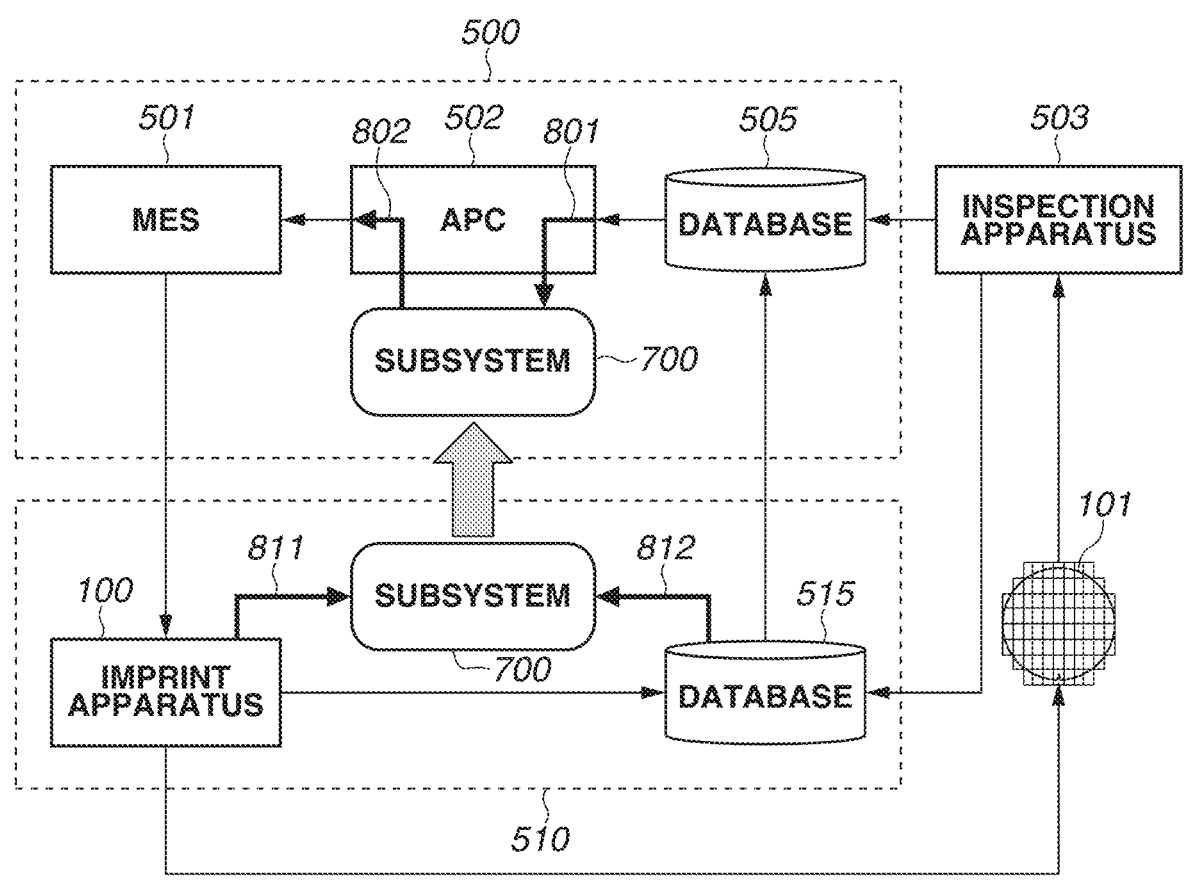
FIG. 9 is a diagram illustrating a manufacturing system of a product according to a first exemplary embodiment.

FIG. 9 is a diagram illustrating a manufacturing system of a product according to the present exemplary embodiment. The subsystem 700 in the present exemplary embodiment is incorporated into the correction system 500, and outputs correction data to the MES 501. The subsystem 700 is connected to the database 505 via a pathway 801, and can acquire processing data and a processing condition from the database 505. The subsystem 700 is also connected to the MES 501 via a pathway 802, and can output correction data to the MES 501.

At this time, a relationship between processing data and correction data, and a relationship between a processing condition and processing data may vary for each of a plurality of imprint apparatuses 100. Even for the same imprint apparatus 100, a relationship between processing data and correction data, and a relationship between a processing condition and processing data may vary as time passes. Thus, the correction model 701 and the apparatus model 702 included in the subsystem 700 need to be updated. In view of the foregoing, the apparatus system 510 in the present exemplary embodiment updates the subsystem 700 and outputs information regarding the updated subsystem 700 to the correction system 500. The information regarding the subsystem 700 that is to be output to the correction system 500 can include information regarding a program for implementing a function of the subsystem 700. The information regarding the subsystem 700 can further include information regarding a parameter defining a model, such as the number of layers, the number of neurons, or a stochastic variable of a neural network forming the correction model 701 and the apparatus model 702.

In the apparatus system 510, the subsystem 700 is connected to the imprint apparatus 100 via a pathway 811, and can acquire a processing condition and correction data. The subsystem 700 is connected to the database 515 via a pathway 812, and can acquire processing data. Machine learning is thereby performed in a state in which processing data for a new processing condition and correction data is added to learning data, and the correction model 701 and the apparatus model 702 are updated. Information regarding the subsystem 700 that incorporates the updated correction model 701 and the apparatus model 702 is output to the correction system 500, and the existing subsystem 700 is replaced with the updated subsystem 700. Then, the correction system 500 acquires correction data using the updated subsystem 700.

The subsystem 700 is desirably updated when imprint processing of one or a plurality of substrates 101 is completed. Alternatively, the subsystem 700 may be updated when the apparatus system 510 receives an update request of the subsystem 700 from the correction system 500.

Then, the subsystem 700 is incorporated into the correction system 500, and the subsystem 700 outputs correction data using processing data and a processing condition held in the database 505 as input. The correction data output from the subsystem 700 is output to the MES 501 together with another piece of correction data acquired by the APC 502. The MES 501 outputs a processing condition corrected based on the correction data output from the APC 502, to the imprint apparatus 100. The imprint apparatus 100 performs imprint processing in accordance with the corrected processing condition.

At this time, the subsystem 700 may operate in place of the APC 502. In other words, the subsystem 700 is directly connected to the database 505 without the APC 502, and can acquire processing data and a processing condition directly from the database 505. The subsystem 700 is also directly connected to the MES 501 without the APC 502, and can output correction data directly to the MES 501.

In addition, the MES 501 may determine whether to correct a processing condition based on correction data output from the APC 502. For example, if correction data does not fall within a predefined allowable range, the MES 501 may determine not to correct a processing condition. Alternatively, if a difference between a processing condition to be applied to another imprint apparatus 100 and the corrected processing condition does not fall within an allowable range, the MES 501 may determine not to correct the processing condition. If the MES 501 determines not to correct a processing condition, the MES 501 may correct the processing condition using partial correction data, or divide the correction data and correct the processing condition step by step using the divided correction data.

In addition, if there is a plurality of apparatus systems 510, a plurality of subsystems 700 may be incorporated and operated in the correction system 500 for the plurality of respective apparatus systems 510. With this configuration, it is possible to acquire correction data considering characteristics varying for each of the plurality of apparatus systems 510.

As described above, according to the present exemplary embodiment, it is possible to acquire correction data for correcting a processing condition by incorporating the subsystem 700 into the APC 502.

Next, a correction system 500 and an apparatus system 510 according to a second exemplary embodiment will be described. Items not mentioned in the second exemplary embodiment can follow those in the first exemplary embodiment. In the present exemplary embodiment, a subsystem 700 is incorporated and operated not in the correction system 500 but in the apparatus system 510.

Figure 10:
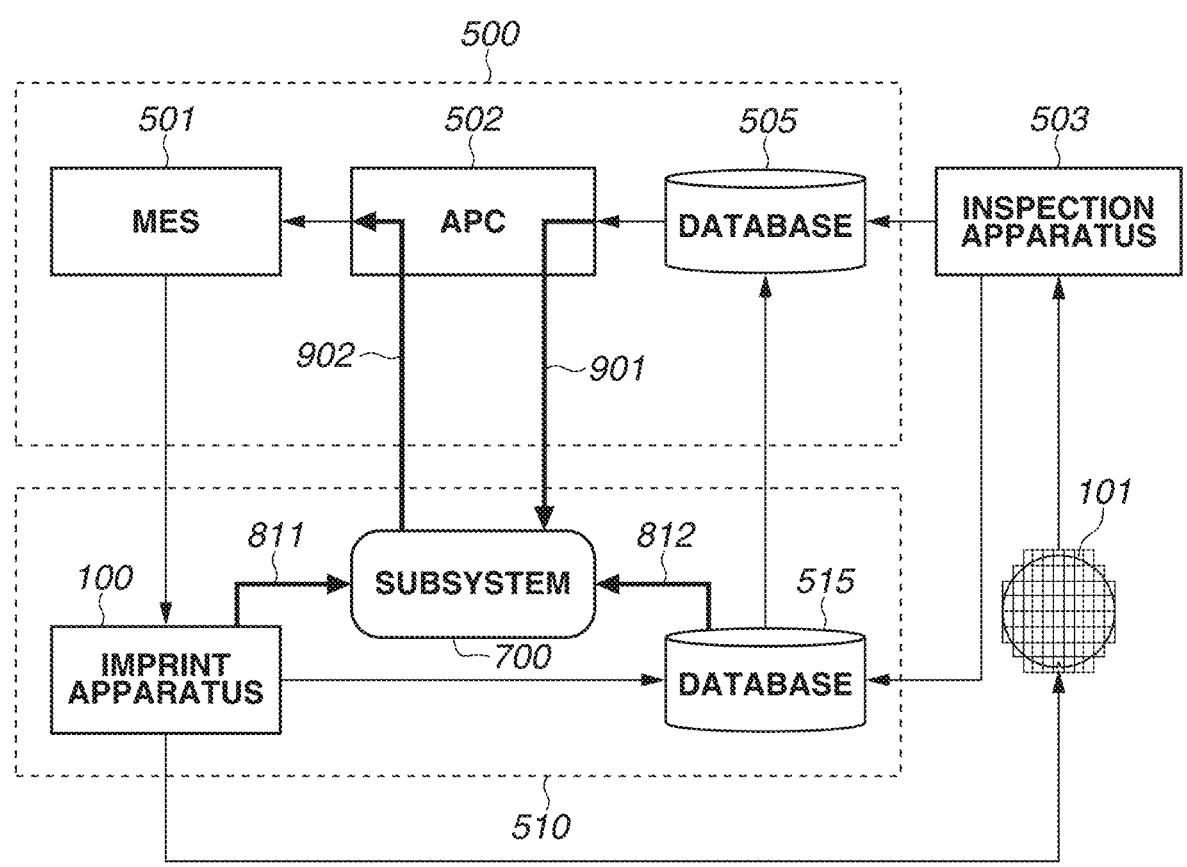
FIG. 10 is a diagram illustrating a manufacturing system of a product according to a second exemplary embodiment.

FIG. 10 is a diagram illustrating a manufacturing system of a product according to the present exemplary embodiment. The subsystem 700 according to the present exemplary embodiment is incorporated into the apparatus system 510, and outputs correction data to the MES 501. The subsystem 700 is connected to the database 505 via a pathway 901, and can acquire processing data and a processing condition from the database 505. The subsystem 700 is connected to the MES 501 via a pathway 902, and can output correction data to the MES 501.

In addition, similarly to the first exemplary embodiment, the apparatus system 510 updates the subsystem 700. The subsystem 700 outputs correction data using processing data and a processing condition held in the database 505 as input. The correction data output from the subsystem 700 is output to the MES 501 together with another piece of correction data acquired by the APC 502. The MES 501 outputs a processing condition corrected based on the correction data, to the imprint apparatus 100, and the imprint apparatus 100 performs imprint processing in accordance with the corrected processing condition.

In the apparatus system 510, a subsystem 700 for update and a subsystem 700 for acquiring correction data may be prepared. The subsystem 700 for update may be updated at an arbitrary timing, and the subsystem 700 for acquiring correction data may be replaced with the subsystem 700 for update at a specific timing such as a time when imprint processing of one or a plurality of substrates 101 is completed.

In addition, the subsystem 700 may be incorporated and operated in an information processing apparatus independent from the correction system 500 and the apparatus system 510. In this case, the information processing apparatus in which the subsystem 700 is incorporated is connected to the correction system 500, the apparatus system 510, and the inspection apparatus 503 via a network, and can transmit and receive various types of information thereto and therefrom.

As described above, according to the present exemplary embodiment, it is possible to acquire correction data for correcting a processing condition by incorporating the subsystem 700 into the apparatus system 510.

(Manufacturing Method of Product)

A manufacturing method of a product according to the present exemplary embodiment will be described. FIGS. 11A to 11F are diagrams illustrating a manufacturing method of a product. The pattern of a cured material formed using the imprint apparatus is permanently used in at least part of various products, or temporarily used in manufacturing various products. Examples of the products include an electrical circuit element, an optical element, a microelectromechanical system (MEMS), a recording element, a sensor, and a mold. Examples of the electrical circuit element include a volatile or nonvolatile semiconductor memory such as a dynamic random access memory (DRAM), a static RAM (SRAM), a flash memory, and a magnetic RAM (MRAM), and a semiconductor element such as a large-scale integrated circuit (LSI), a charge-coupled device (CCD) sensor, an image sensor, and an FPGA. Examples of the mold include an imprinting mold.

The pattern of the cured material is used as-is as a component of at least part of the above-described products, or temporarily used as a resist mask. After etching or ion implantation is performed in a processing process of the substrate, the resist mask is removed.

Figure 11A:
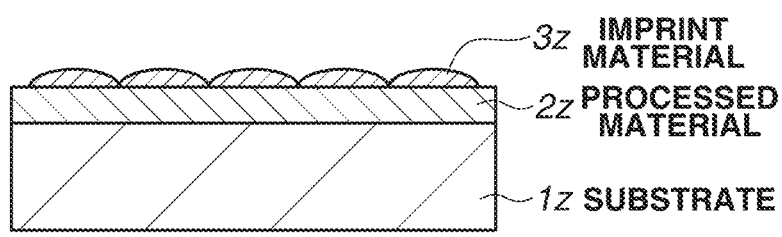
FIGS. 11A to 11F are diagrams illustrating a product manufacturing method.

Next, a specific manufacturing method of a product will be described. As illustrated in FIG. 11A, a substrate 1z, such as a silicon substrate, that has a surface on which a processed material 2z, such as an insulating material, is formed is prepared. An imprint material 3z is applied onto the surface of the processed material 2z by an inkjet method. FIG. 11A illustrates a state in which the imprint material 3z formed of a plurality of droplets is applied on the substrate 1z.

Figure 11B:
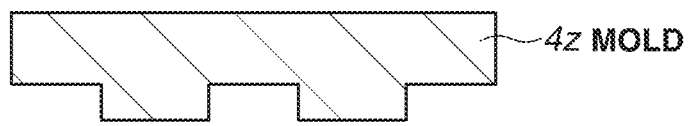
Figure 11C:
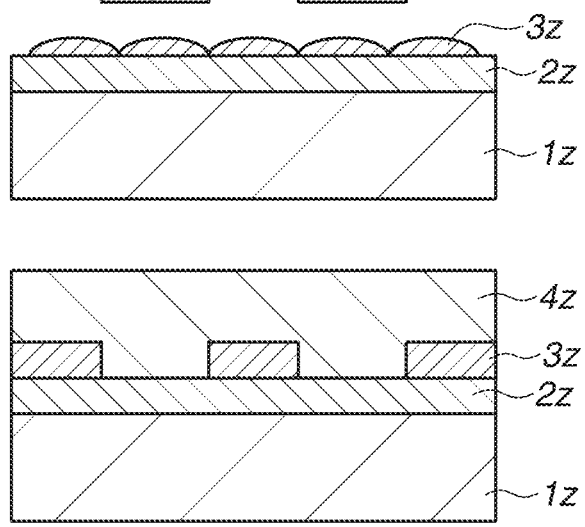

As illustrated in FIG. 11B, an imprinting mold 4z is caused to face the imprint material 3z on the substrate 1z with a side on which an uneven pattern is formed facing the imprint material 3z. As illustrated in FIG. 11C, the substrate 1z on which the imprint material 3z is applied and the mold 4z are brought into contact with each other, and pressure is added. A clearance gap between the mold 4z and the processed material 2z is filled with the imprint material 3z. If light is emitted in this state via the mold 4z as curing energy, the imprint material 3z cures.

Figure 11D:
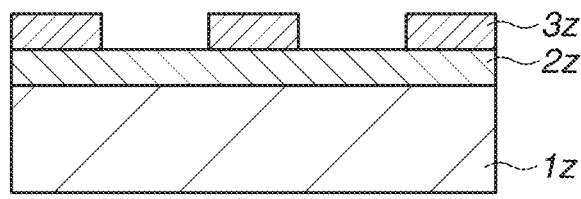

As illustrated in FIG. 11D, after the imprint material 3z is cured, if the mold 4z and the substrate 1z are separated from each other, a pattern of the cured material of the imprint material 3z is formed on the substrate 1z. The pattern of the cured material has a shape in which a recess portion of the mold corresponds to a protruding portion of the cured material and a protruding portion of the mold corresponds to a recess portion of the cured material. In other words, the uneven pattern of the mold 4z is transferred onto the imprint material 3z.

Figure 11E:
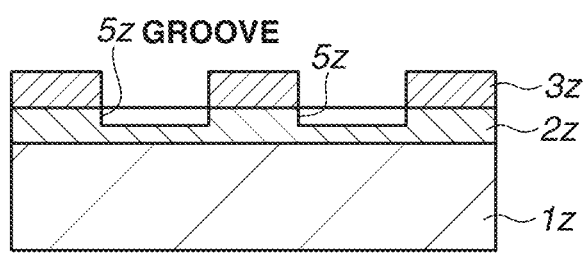
Figure 11F:
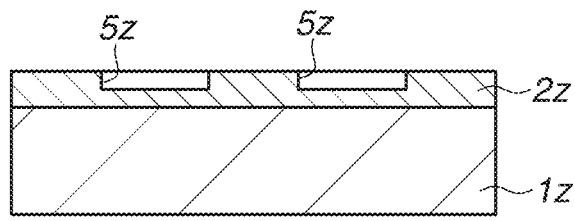

As illustrated in FIG. 11E, if etching is performed on the pattern of the cured material as an etching resistance mask, a portion having no cured material or having a thinly-remaining cured material is removed from the surface of the processed material 2z, and grooves 5z are formed. As illustrated in FIG. 11F, if the pattern of the cured material is removed, a product in which the grooves 5z are formed on the surface of the processed material 2z can be obtained. In this example, the pattern of the cured material is removed, but the pattern of the cured material may be used as, for example, an interlayer insulation film included in a semiconductor element without being removed even after the processing. In other words, the pattern of the cured material may be used as a component of the product.

The description has been given of an example in which a mold for circuit pattern transfer that is provided with an uneven pattern is used as the mold 4z, but a mold having a planar portion without having an uneven pattern (blank template) may be used. The blank template is used in a planarizing apparatus that performs planarization processing of flatly shaping a composition on the substrate by the planar portion. The planarization processing includes a process of curing a curable composition supplied on the substrate, by emitting light onto or heating the curable composition in a state in which the planar portion of the blank template is kept in contact with the curable composition.

Heretofore, the exemplary embodiments of the present invention have been described. The present invention, however, is not limited to these exemplary embodiments, and various modifications and changes can be made without departing from the spirit of the present invention. The imprint apparatus has been described as an example of a lithography apparatus, but the lithography apparatus is not limited to this. As an example of the lithography apparatus, an exposure apparatus that emits light onto an original on which a pattern is formed, and projects the pattern onto a substrate based on light from the original may be used. Alternatively, as an example of the lithography apparatus, a drawing apparatus that performs drawing onto a substrate by charged particle radiation (electron beams, ion beams, etc.) via a charged particle optical system, and forms a pattern onto the substrate may be used. In addition, examples of the lithography apparatus can also include a manufacturing apparatus that executes a process other than the above-described processes executed by an apparatus such as an imprint apparatus in manufacturing a product such as a device. Examples of such a manufacturing apparatus include a coating apparatus that coats the surface of a substrate with a photosensitive medium, and a development apparatus that develops a substrate on which a pattern is transferred.

While the first exemplary embodiment and the second exemplary embodiment are executed independently, the first exemplary embodiment and the second exemplary embodiment can also be executed in combination.

According to an exemplary embodiment of the present invention, it is possible to provide an information processing apparatus that provides a unit that acquires correction data for correcting a processing condition to be applied to processing performed in a lithography apparatus, a program, a lithography apparatus, a manufacturing method of a product, and a manufacturing system of a product.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-028394, filed Feb. 20, 2019, which is hereby incorporated by reference herein in its entirety.

What is claimed is:

1. An information processing apparatus for outputting first correction data for correcting a first processing condition of processing to be performed in a lithography apparatus configured to form a pattern onto a substrate, comprising:
a first system configured to output the first correction data based on the first processing condition and a first processing result indicating a result of execution of the processing,
wherein the first system includes a first model configured to output a second correction data in case where the first processing result or a second processing result is input, and a second model configured to output the second processing result in case where the second processing condition is input,
wherein the first system causes the first model to output the second correction data for correcting the first processing condition relating to the first processing result by inputting the first processing result into the first model,
wherein the first system causes the second model to output the second processing result by inputting into the second model the second processing condition corrected using third correction data updated using the second correction data output from the first model, and
wherein the first system outputs the third correction data as the first correction data in a case where the second processing result output from the second model is within a predefined allowable range.

2. The information processing apparatus according to claim 1, wherein, in a case where the second processing result output from the second model does not fall within the predefined allowable range, the first system re-corrects the first processing condition using the third correction data updated using the second correction data output by inputting into the first model the second processing result output from the second model and outputs the third correction data as the first correction data in a case where the second processing result output by inputting the second processing condition into the second model is within the predefined allowable range.

3. The information processing apparatus according to claim 1, wherein the first model includes a learning model generated by machine learning that uses a processing result indicating a result of execution of the processing and a correction data for correcting a processing condition of the processing as learning data.

4. The information processing apparatus according to claim 1, wherein the second model includes a learning model generated by machine learning using a processing condition of the processing and a processing result indicating a result of execution of the processing as learning data.

5. The information processing apparatus according to claim 1,
wherein the lithography apparatus is an imprint apparatus configured to form a pattern by bringing a pattern portion of an original and an imprint material on a substrate into contact with each other,
wherein the first processing result includes information regarding at least one of a measurement value related to a position of a mark formed on the original, a measurement value related to a position of a mark formed on the substrate, a captured image of the mark formed on the original, a captured image of the mark formed on the substrate, a captured image of the imprint material in contact with the pattern portion, a measurement value of force acting on the original, a position shift amount of the pattern, a dimension of a line width of the pattern, presence or absence of the pattern not satisfying a standard, a position of the pattern not satisfying the standard, and an electrical characteristic of a semiconductor device manufactured from the substrate on which the pattern is formed, and wherein the first processing condition includes information regarding at least one of an amount of the imprint material to be supplied onto the substrate, a position to which the imprint material is to be supplied, a position of the mark formed on the original, a position of the mark formed on the substrate, a time period for which the pattern portion and the imprint material on the substrate are kept in contact with each other, magnitude of force to be added to the original in a state in which the pattern portion and the imprint material on the substrate are in contact with each other, an amount of light to be emitted onto the imprint material, a time period for which the light is to be emitted, magnitude of force to be added to the original, an irradiation amount of light to be emitted for heating the substrate, an irradiation amount distribution, and an irradiation time period.

6. The information processing apparatus according to claim 4, wherein the first correction data includes information for correcting the information included in the first processing condition.

7. The information processing apparatus according to claim 1, wherein information regarding the first system is output to a second system that outputs the first processing condition to the lithography apparatus.

8. The information processing apparatus according to claim 1, wherein the first system acquires the first processing condition and the first processing result from a second system that outputs the first processing condition to the lithography apparatus, and outputs the first correction data acquired based on the first processing condition and the first processing result, to the second system.

9. A non-transitory computer readable storage medium storing a program for causing a computer to output first correction data for correcting a first processing condition of processing to be performed in a lithography apparatus that forms a pattern onto a substrate using a first system that outputs the first correction data based on the first processing condition and a first processing result indicating a result of execution of the processing, wherein the first system includes a first model that outputs a second correction data in case where the first processing result or a second processing result is input, and a second model that outputs the second processing result in case where a second processing condition is input, wherein the first system causes the first model to output the second correction data for correcting the first processing condition relating to the first processing result by inputting the first processing result into the first model, wherein the first system causes the second model to output the second processing result by inputting into the second model the second processing condition corrected using the third correction data updated using the second correction data output from the first model, and wherein the first system outputs the third correction data as the first correction data in a case where the second processing result output from the second model is within a predefined allowable range.

10. A lithography apparatus for forming a pattern onto a substrate, the lithography apparatus comprising:

an information processing apparatus configured to output first correction data for correcting a processing condition of processing to be performed in the lithography apparatus, wherein the information processing apparatus includes a first system configured to output the correction data based on the processing condition and a processing result indicating a result of execution of the processing, wherein the first system includes a first model that outputs the correction data in case where the processing result is input, and a second model that outputs the processing result in case where the processing condition is input, wherein the first system causes the first model to output second correction data for correcting the first processing condition relating to the first processing result by inputting the processing result into the first model, wherein the first system causes the second model to output the processing result by inputting into the second model the second processing condition corrected using the correction data output from the first model, and wherein the first system outputs the correction data in a case where the processing result output from the second model is within a predefined allowable range.

11. A manufacturing method of a product comprising:

obtaining a first processing result indicating a result of execution of processing to be performed in a lithography apparatus configured to form a pattern onto a substrate;

outputting a second correction data, from a first model, for correcting the first processing condition relating to a first processing result indicating a result of execution of the processing by inputting the first processing result into the first model;

outputting a second processing result, from a second model, by inputting into the second model a second processing condition corrected using third correction data updated using the second correction data output from the first model;

outputting the third correction data as the first correction data in a case where the second processing result output from the second model is within a predefined allowable range;

forming a pattern onto a substrate using the lithography apparatus in accordance with a processing condition corrected using the first correction data;

processing the substrate on which the pattern is formed; and manufacturing a product from the processed substrate.

12. A manufacturing system of a product comprising:

a first information processing apparatus configured to output correction data for correcting a condition of processing to be performed in a lithography apparatus configured to form a pattern onto a substrate;

wherein the first information processing apparatus includes a first system configured to output the first correction data based on the first processing condition and a processing result indicating a result of execution of the processing, the lithography apparatus; and a second information processing apparatus configured to output the processing condition to the lithography apparatus, wherein the second information processing apparatus includes the second system outputs the processing condition corrected using the correction data output by the first system, to the lithography apparatus, wherein the first system includes a first model that outputs the correction data in case where the processing result is input, and a second model that outputs the processing result in case where the processing condition is input, wherein the first system causes the first model to output the correction data for correcting the processing condition relating to the processing result by inputting the processing result into the first model, wherein the first system causes the second model to output the processing result by inputting into the second model the processing condition corrected using the correction data output from the first model, and wherein the first system outputs the correction data in a case where the processing result output from the second model is within a predefined allowable range.

13. The manufacturing system of a product according to claim 12, further comprising an inspection apparatus configured to inspect a substrate on which a pattern is formed by the lithography apparatus, wherein the first processing result includes data of a result of an inspection performed by the inspection apparatus.

14. The manufacturing system of a product according to claim 12, wherein the manufacturing system includes a plurality of the lithography apparatuses, and wherein the first system used in at least one of the plurality of lithography apparatuses is different from the first system used in the other lithography apparatuses.

15. A method for outputting first correction data for correcting a first processing condition of processing to be performed in a lithography apparatus configured to form a pattern onto a substrate;

outputting a second correction data, from a first model, for correcting the first processing condition relating to a first processing result indicating a result of execution of the processing by inputting the first processing result into the first model;

outputting a second processing result, from a second model, by inputting into the second model a second processing condition corrected using third correction data updated using the second correction data output from the first model, and outputting the third correction data as the first correction data in a case where the second processing result output from the second model is within a predefined allowable range.

* * * * *